(12) United States Patent
Moens et al.

(10) Patent No.: US 7,989,886 B2
(45) Date of Patent: Aug. 2, 2011

(54) ALIGNMENT OF TRENCH FOR MOS

(75) Inventors: Peter Moens, Zottegem (BE); Marnix Tack, Merelbeke (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 140 days.

(21) Appl. No.: 12/560,025

(22) Filed: Sep. 15, 2009

(65) Prior Publication Data
US 2010/0065908 A1 Mar. 18, 2010

Related U.S. Application Data

(62) Division of application No. 11/408,924, filed on Apr. 24, 2006, now Pat. No. 7,608,510.

(30) Foreign Application Priority Data

Apr. 26, 2005 (GB) .................................. 0508407.4

(51) Int. Cl.
*H01L 29/49* (2006.01)
(52) U.S. Cl. ................ 257/330; 257/332; 257/E29.118; 257/E29.131; 257/E29.262; 257/E21.629
(58) Field of Classification Search .................. 257/330, 257/332, E29.118, E29.131, E29.262, E21.41, 257/E21.629, E21.652, E21.653; 438/268, 438/300, FOR. 192
See application file for complete search history.

(56) References Cited

U.S. PATENT DOCUMENTS

| | | | |
|---|---|---|---|
| 4,530,149 A * | 7/1985 | Jastrzebski et al. | 438/156 |
| 5,216,275 A | 6/1993 | Chen | |
| 5,554,870 A * | 9/1996 | Fitch et al. | 257/334 |
| 5,627,395 A * | 5/1997 | Witek et al. | 257/350 |
| 6,353,252 B1 | 3/2002 | Yasuhara et al. | |
| 6,399,987 B2 | 6/2002 | Kim | |
| 6,555,873 B2 | 4/2003 | Disney et al. | |
| 6,667,213 B2 | 12/2003 | Disney | |
| 6,693,323 B2 | 2/2004 | Sato et al. | |
| 6,853,033 B2 | 2/2005 | Liang et al. | |

(Continued)

FOREIGN PATENT DOCUMENTS

JP  11-251581  9/1999

(Continued)

OTHER PUBLICATIONS

Search Report, European Patent Office, Jul. 10, 2007 relating to EP06 006 084.5—2203.

(Continued)

*Primary Examiner* — George Fourson

(74) *Attorney, Agent, or Firm* — Bacon & Thomas PLLC

(57) ABSTRACT

Manufacturing a power transistor by forming a gate structure on a first layer, forming a trench in the first layer, self aligned with the gate structure, and forming part of the transistor in the trench. By forming a spacer next to the gate, the spacer and gate can be used as a mask when forming the trench, to allow space for a source region next to the gate. The self-aligning rather than forming the gate after the trench means the alignment is more accurate, allowing size reduction. Another aspect involves forming a trench in a first layer, filling the trench, forming a second layer on either side of the trench with lateral overgrowth over the trench, and forming a source region in the second layer to overlap the trench. This overlap can enable the chip area to be reduced.

5 Claims, 9 Drawing Sheets

U.S. PATENT DOCUMENTS

| | | |
|---|---|---|
| 7,064,039 B2 | 6/2006 | Liu |
| 7,381,601 B2 | 6/2008 | Kim et al. |
| 2001/0044188 A1 | 11/2001 | Heo et al. |
| 2002/0090787 A1 | 7/2002 | Chan et al. |
| 2003/0006453 A1 | 1/2003 | Liang et al. |
| 2003/0136985 A1 | 7/2003 | Murthy et al. |
| 2003/0136995 A1 | 7/2003 | Geusic et al. |
| 2003/0214009 A1 | 11/2003 | Parthasarathy et al. |
| 2004/0072395 A1 | 4/2004 | Liu |
| 2004/0195626 A1 | 10/2004 | Yamada et al. |
| 2005/0026360 A1 | 2/2005 | Geusic et al. |
| 2006/0030094 A1 | 2/2006 | Chui et al. |
| 2008/0224239 A1 | 9/2008 | Lin et al. |

FOREIGN PATENT DOCUMENTS

| | | |
|---|---|---|
| JP | 2000-208757 A | 7/2000 |
| JP | 2001-332635 | 11/2001 |
| WO | WO 03/098700 A2 | 11/2007 |

OTHER PUBLICATIONS

Yung C. Liang et al., "Oxide-Bypassed VDMOS (OBVDMOS): An Alternative to Superjunction High Voltage MOS Power Devices", IEEE Electron Devices Letters, vol. 22, No. 8, Aug. 2001, pp. 407-409.

Klan Paau Gan et al., "A Simple Technology for Superjunction Device Fabrication: Polyflanked VDMOSFET", IEEE Electron Device Letters, vol 23, No. 10, Oct. 2002, pp. 627-629.

Xin Yang et al., "Tunable Oxide-Bypassed Trench Gate MOSFET: Breaking the Ideal Superjunction MOSFET Performance Line at Equal Column Width", IEEE Electron Device Letters, vol. 24, No. 11, Nov. 2003, pp. 704-706.

Search Report, British Patent Office, Aug. 4, 2005 relating to British Patent Application No. GB 0508407.4.

* cited by examiner

US 7,989,886 B2

ALIGNMENT OF TRENCH FOR MOS

RELATED APPLICATION DATA

This application is a divisional of application Ser. No. 11/408,924 filed Apr. 24, 2006.

FIELD OF THE INVENTION

This invention relates to semiconductor devices and methods of manufacturing such devices.

DESCRIPTION OF THE RELATED ART

Various known MOS devices involve forming a trench. For example, power devices can have a source or a gate in a trench, generally to enable a larger volume device without a corresponding increase in chip area. In power MOSFET devices, one of the most important performance parameters is the on resistance. In general, the drift region and the channel are the two dominant components of a power VDMOS (vertical double diffused MOS) ON-resistance. Various different directions have been explored to reduce the contribution to the ON-resistance of either of these regions. One problem of many power devices, especially of devices such as VVMOS, VDMOS and RMOS, is to get both high breakdown voltage and low on-resistance. For example, in advanced power MOSFET, RMOS (or UMOS), the voltage sustaining layer is an n+-epi-layer, the theoretical limit of the on-resistance in unit area Ron is Ron=$7.4\times10^{-9}V_B^{2.5}[\Omega.cm^2]$ It is also known to use superjunctions for high voltage transistors having low ON resistance. An early example is shown in U.S. Pat. No. 5,216,275. Super-Junction MOS devices aim at reducing the resistance of the drift region by increasing its doping. The drift region contains two kinds of regions with opposite types of conduction, i.e. n-regions and p-regions. These two regions of different conduction types are alternately arranged. The n-regions and the p-regions contribute charges with opposite signs, and the fields induced by them largely cancel each other out. The doping concentrations of the n-regions and the p-regions therefore can be much higher than that in the conventional drift layer. And, the on-resistance of the former is much lower. It is also known from U.S. Pat. No. 6,693,323 to refine such superjunctions. The n-type drift regions are heavily doped and the thickness of drift layer is reduced corresponding to the heavy doping, so that the ON-resistance of the vertical super-junction MOSFET can be reduced to ⅕ of the ON-resistance of a conventional vertical MOSFET. By further narrowing n-type drift regions and by further increasing the impurity concentration in n-type drift regions, the on-resistance and the trade-off between the on-resistance and the breakdown voltage can be further reduced. This super junction MOSFET differs from the conventional super-junction MOSFET in the way of forming drift layer (that is, the way of forming p-type partition regions and n-type partition regions) and the resulting drift layer structure. In more detail, since n-type drift regions and p-type partition regions are formed by diffusing respective impurity ions, impurity concentration distributions are caused in the drift layer.

It is also known from U.S. Pat. No. 6,353,252 that in a high breakdown voltage semiconductor device, a drift region is divided into a plurality of long regions each interposed between a plurality of trenches, and a depletion layer expands in a drift region from an interface between the drift region and each of the trenches when a reversed bias is applied. Thus, the impurity concentration of the drift region can normally be heightened to cause a high breakdown voltage. Consequently, the on-resistance can be lowered by increasing the impurity concentration of the drift region. In this case the drain electrode is on the same side as the gate and source, but the flow of current is predominantly parallel to the surface of the chip, thus this is called a lateral structure, rather than a vertical structure.

Other variations have been tried. In Yung C. Liand et al, <<Oxide bypassed VDMOS (OBVDMOS): An Alternative to Superjunction High Voltage MOS Power Devices", IEEE Electron Devices Letters, Vol. 22. NO. 8, August 2001, an oxide bypass is shown. This is also shown in US 2003/0006453 A1, and includes an oxide layer then a metal layer at the sides of the drift region which is below a gate, as shown in FIG. 1.

"A simple Technology for Super-junction Device Fabrication: Poly-flanked VDMOSFET" Kin Paau Gan et al, IEEE Electron Devices Letters, Vol. 23. No. 10, October 2002, shows a thin oxide between the P and N columns in the drift region to reduce interdiffusion, and a poly flanked structure for edge termination.

"Tuneable Oxide-Bypassed Trench Gate MOSFET: Breaking the Ideal Super-junction MOSFET Performance Line at Equal Column Width" Xin Yang et al, IEEE Electron Devices Letters, Vol. 24. No. 11, November 2003 shows using a tunable oxide bypassed superjunction device to tune the off-state blocking capability to compensate for material and process variations.

U.S. Pat. No. 6,555,873 shows a high voltage FET with a trenched gate, in which a lower on-state resistance is achieved by the use of multiple, parallel-arranged extended drain or drift regions. U.S. Pat. No. 6,667,213 shows a high-voltage transistor with an extended drain region which includes forming parallel arranged drift regions, each of which is interleaved with an insulating layer and a conducting layer that functions as a field plate.

There remains a need for improved devices or methods.

SUMMARY OF THE INVENTION

An object of the invention is to provide improved semiconductor devices and methods of manufacturing such devices.

According to a first aspect, the invention provides:

a method of manufacturing a transistor having the steps of forming a control electrode structure such as a gate structure on a first layer, forming a trench in the first layer, self aligned with the control electrode structure, e.g. the gate structure, and forming part of the transistor in the trench. The growth of a thick oxide in the trench serves as a MOS capacitor to deplete the drift region under reverse bias conditions.

The present invention may also be applied to a bipolar transistor or diode in accordance with certain embodiments. For a bipolar transistor, the bulk should become the base, the source should become the emitter and the drain should become the collector. In the case of a HV diode, the n+ (source) should be implanted p+, becoming the anode, the drain becoming the cathode of the diode.

The self-aligning of the trench rather than forming the control region such as the gate after the trench means that the transistor structure can have reduced dimensions. Smaller dimensions of the unit cell are reflected in a smaller Ron, meaning a smaller device (less silicon area) for the same performance. The self alignment means that alignment is no longer dependent on the accuracy of alignment of successive masks, so smaller tolerances and smaller feature sizes can be used reliably. Yes This can lead to more integration and so lower on resistance. Techniques that can contribute to smaller feature sizes can be valuable to semiconductor manufacturers in general and to those who integrate power devices in particular. In some such cases, reduction of the feature sizes can allow the integration of greater numbers of transistor cells per unit area. This can lead to lower ON resistance for a power transistor that has many unit cells acting in parallel.

An additional feature of some embodiments is the transistor being a power transistor having multiple cells, each cell having a trench.

Another such additional feature is the step of forming a spacer next to the control electrode, e.g. the gate, and using the spacer and the control electrode, e.g. gate as a mask when forming the trench. This allows space for one or more main electrode regions such as a drain or source region next to the gate.

Another such additional feature is forming a main electrode region, e.g. a source or drain region in the first layer next to the control electrode, e.g. gate, before forming the spacer.

Another such additional feature is forming the main electrode regions, e.g. source or drain region by forming a patterned mask over the control electrode, e.g. gate, then implanting the main electrode regions, e.g. source or drain region in the first layer, self aligned to the control electrode structure, e.g. gate structure, then removing the mask.

Another such additional feature is forming the spacer by depositing a spacer layer of a defined thickness over the control electrode structure, e.g. gate structure and removing parts other than parts at the sides of the control electrode structure, e.g. gate structure.

Another such additional feature is forming a conductive element in the trench, insulated from the first layer. This can be coupled to a main electrode region, e.g. source or drain region for example, or to the control electrode structure such as a gate structure for example.

Another such additional feature is the transistor having a drift region in the first layer.

Another such additional feature is the transistor being a vertical MOS device having a buried drain or source below the first layer.

Another such feature is that the transistor is a discrete component wherein a drain electrode is connected at the backside of the component, e.g. at the backside of a wafer.

Another aspect provides a method of manufacturing a transistor having the step of forming a trench in a first layer, filling the trench, forming a second layer on either side of the trench with lateral overgrowth over the trench, and forming a main electrode such as a drain or source region in the second layer so as to overlap the trench.

By having the second layer grow over the trench, and thus enable the main electrode region, e.g. drain or source region to overlap the trench, the chip area taken up by the device can be reduced for a given size of main electrode region, e.g. drain or source region. This is an alternative implementation. Such reduced area can provide increased integration, leading to lower costs or lower on resistance or power devices and so on.

An additional feature is the step of forming a conductive element in the trench, insulated from the first layer by an insulating layer on a sidewall of the trench, a main electrode region, e.g. source or drain region extending over the insulating layer.

Another such additional feature is forming a top layer to seal a top of the conductive element in the trench, the top layer being resistant to growth of the second layer. This can help maintain a gap above the trench to enable a contact to be made without needing a separate mask and etching step to open a gap in the second layer.

Another such additional feature is forming an insulated spacer at the sides of the second layer over the trench. This can enable the conductive element in the trench and any contact coupled to it, to be insulated from the main electrode regions, e.g. source or drain region, so that they can be set at different potentials.

Another such additional step is removing the top layer where it is not covered by the insulated spacer. This also enables a contact to be made to the conductive element in the trench.

Another such additional feature is forming a control electrode structure such as a gate structure after forming the trench.

Another aspect is a transistor having corresponding features.

Another such additional feature is the transistor having a drift region in the first layer.

Another such additional feature is the transistor being a vertical MOS device having a buried drain or source below the first layer.

Another such feature is a transistor comprising a discrete component wherein a drain electrode is connected at the backside of the component, e.g. at the backside of a wafer.

An additional feature of some embodiments is the transistor being a power transistor having multiple cells, each cell having a trench. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION OF THE INVENTION

Figure 1:
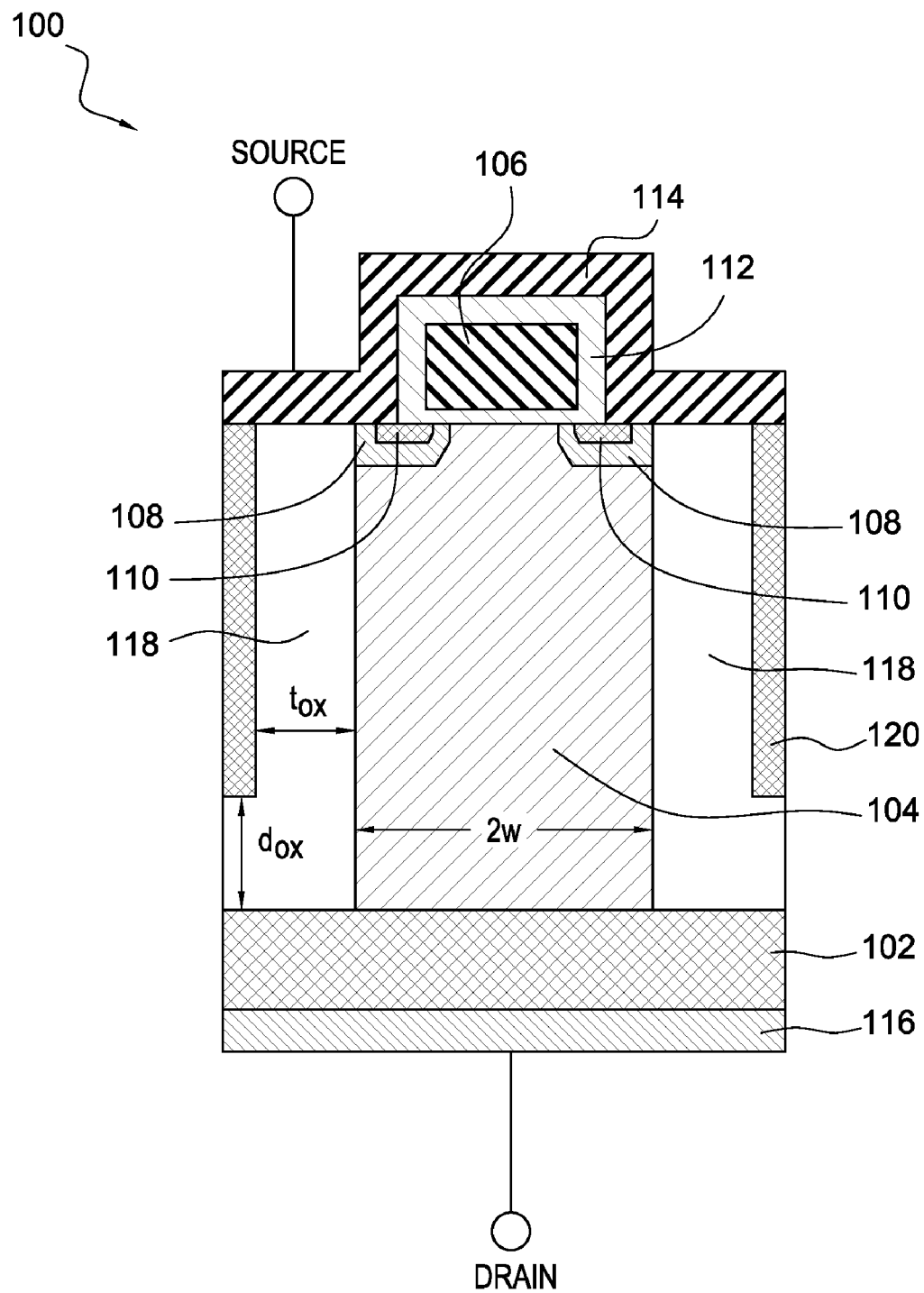
FIG. 1 shows an oxide bypassed VDMOS called a super-MOS, as shown in US 2003/0006453.

The present invention will be described with respect to particular embodiments and with reference to certain drawings but the invention is not limited thereto but only by the claims. Any reference signs in the claims shall not be construed as limiting the scope of the invention. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, the terms top, bottom, over, under and the like in the description and the claims are used for descriptive purposes and not necessarily for describing relative positions.

It is to be understood that the terms so used are interchangeable under appropriate circumstances and that the embodiments of the invention described herein are capable of operation in other orientations than described or illustrated herein.

Moreover, it is to be understood that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B. Where an indefinite or definite article is used when referring to a singular noun e.g. "a" or "an", "the", this includes a plural of that noun unless something else is specifically stated.

As will be described below, a self-aligned method of fabrication is proposed to align the trenches of a trench power device to a control electrode, e.g. a gate. A method to reduce the surface area necessary to contact the trenches is also proposed. The present invention may be applied to a variety of semiconductor devices such as a MOSFET, a bipolar transistor, for example a high voltage diode.

By way of introduction to the embodiments, a known structure will be described. FIG. 1 illustrates a MOSFET 100, known from US 2003/0006453. Like a conventional MOSFET, it is formed on a heavily doped n+ semiconductor substrate 102. The substrate may be a semiconductor wafer as is know to the skilled person. Typically the substrate will be a silicon substrate but the present invention is not limited thereto. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

A more lightly doped epitaxial layer defining drift region 104 is grown on substrate 102. At the top of region 104, p-type body regions 108 are formed. n+ source regions 110 are formed within body regions 108. A gate 106 is formed atop the epitaxial layer across the p-body regions to reach source regions 110, and is insulated therefrom by an oxide layer 112. Metal contacts 114 and 116 are formed for electrical interconnection source regions 110 and substrate 102 to act as source and drain contacts, respectively. Additionally, MOSFET 100 includes sidewall metal-thick-oxide (MTO) dielectric columns 118. Each of dielectric columns 118 extends vertically at the opposite edges of n drift region 104. As such, drift region 104 resembles a column having width 2w. One edge of each dielectric column 118 is adjacent to n drift region 104 of MOSFET 100. The opposite edge of each column 118 is bounded by a vertically extending conductive region 120. Each conductive region 120 is formed of a p+/n+ poly-silicon semiconductor. As well, conductive regions 120 are electrically connected to source metal contact 114.

Functionally, for MOSFET 100 in its off-state, the voltage across each column 118 deposits a charge at the edge of each column 118. This charge, in turn, exerts an electric field on drift region 104 that depletes free carriers in the n column of the drift region 104 laterally. That is, free carriers are redistributed within drift region 104. This alters the original vertical field distribution within the drift region 104 to extend further from the gate. Preferably, the sidewall oxide is thermally grown to obtain the highest breakdown quality, or if any other dielectric material is chosen to replace the oxide, it should have a breakdown field strength equal to or greater than that of the thermal oxide. The dielectric thickness can be controlled.

The specific on-state resistance between drain and source Ron,sp is calculated to be proportion to (w+wMTO)/(Nd*w) where Nd is concentration of dopants, w is the trench column half-width, wMTO is the sum of sidewall oxide thickness and the electrode half-width, welec, that is, wMTO=$t_{ox}$+welec. It may be shown that an optimal ratio of wMTO to w of 4:3 exists for minimum Ron,sp. The thickness of the bottom oxide $d_{ox}$ can be chosen to be the same as or preferably greater than oxide thickness $t_{ox}$.

Owing to additional field modulation by lateral depletion, the doping in the drift region 104 can be raised to a value much higher than that permissible in conventional MOSFETs, thus improving the specific on-resistance to breakdown voltage relationship curve for silicon MOSFET 100. In contrast to known ways of increasing breakdown voltage, no precise matching of doping is needed in MOSFET 100. Instead, for a particular drift region width 2w and doping Nd, it is primarily the sidewall thickness of each column 118, $t_{ox}$, that needs to be controlled to provide the optimal field effect to deplete the column of the n drift region 104 entirely during the off-state. As oxide thickness control technology is well-known, MOSFET 100 can be manufactured more easily and precisely than known charge compensation structures that require the difficult task of precise doping control and multiple epitaxial growth.

To make this structure, in US 2003/0006453 A1 (and U.S. Pat. Nos. 6,555,873 and 6,667,213) the trenches are etched and then the conventional power MOSFET formed (see [0053] in US 2003/0006453 A1). In contrast, in the first embodiment of the present invention, the gate and source are formed first. Then, nitride spacers guarantee that the trenches will be self-aligned to the gate of the MOSFET. In principle, this approach can use only the p-body mask to make the structure. It is compatible with standard smart power technology processing.

Figure 2:
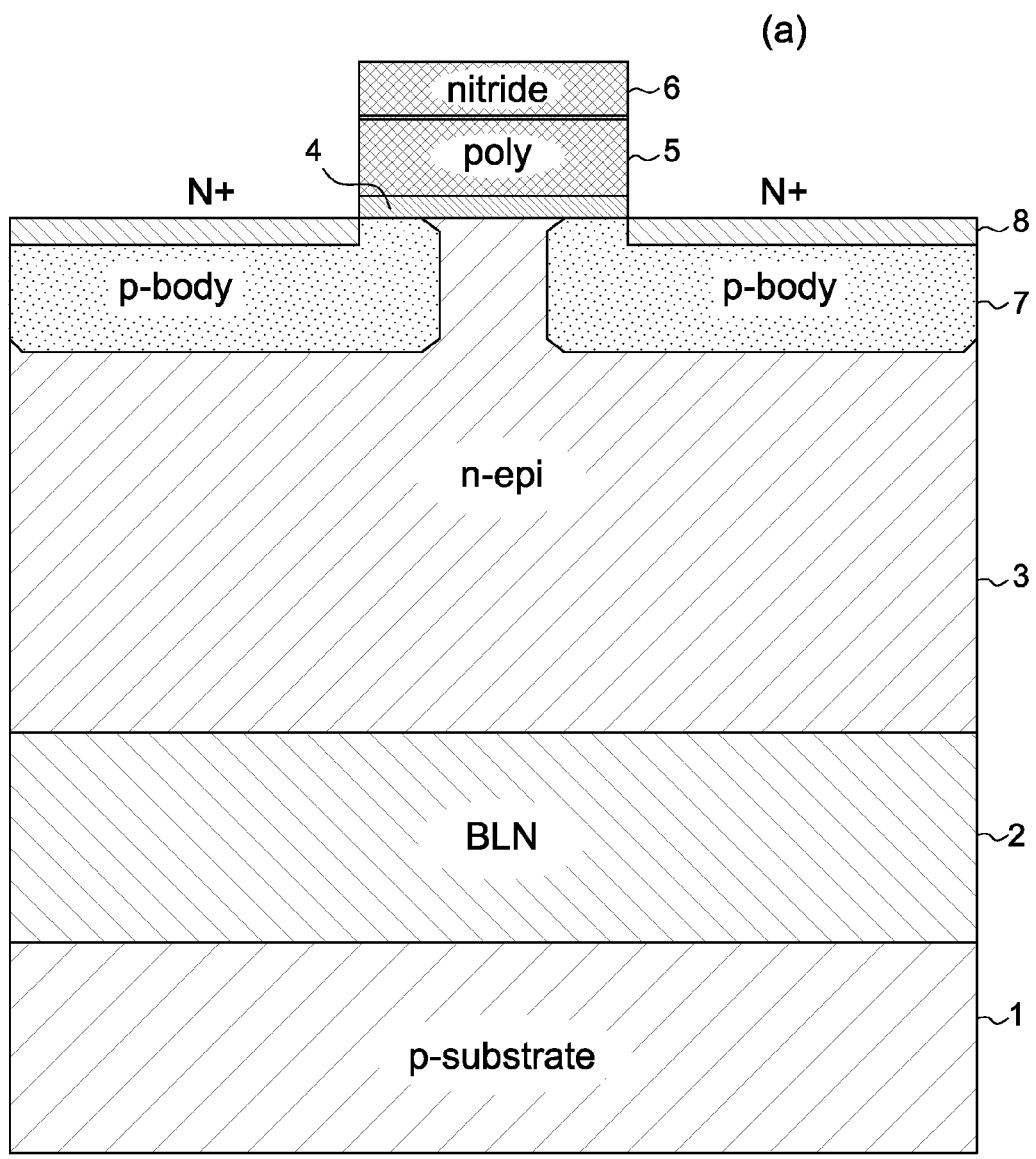
FIGS. 2 to 5 show stages (a) to (d) of a method of manufacturing according to a first embodiment.
Figure 5:
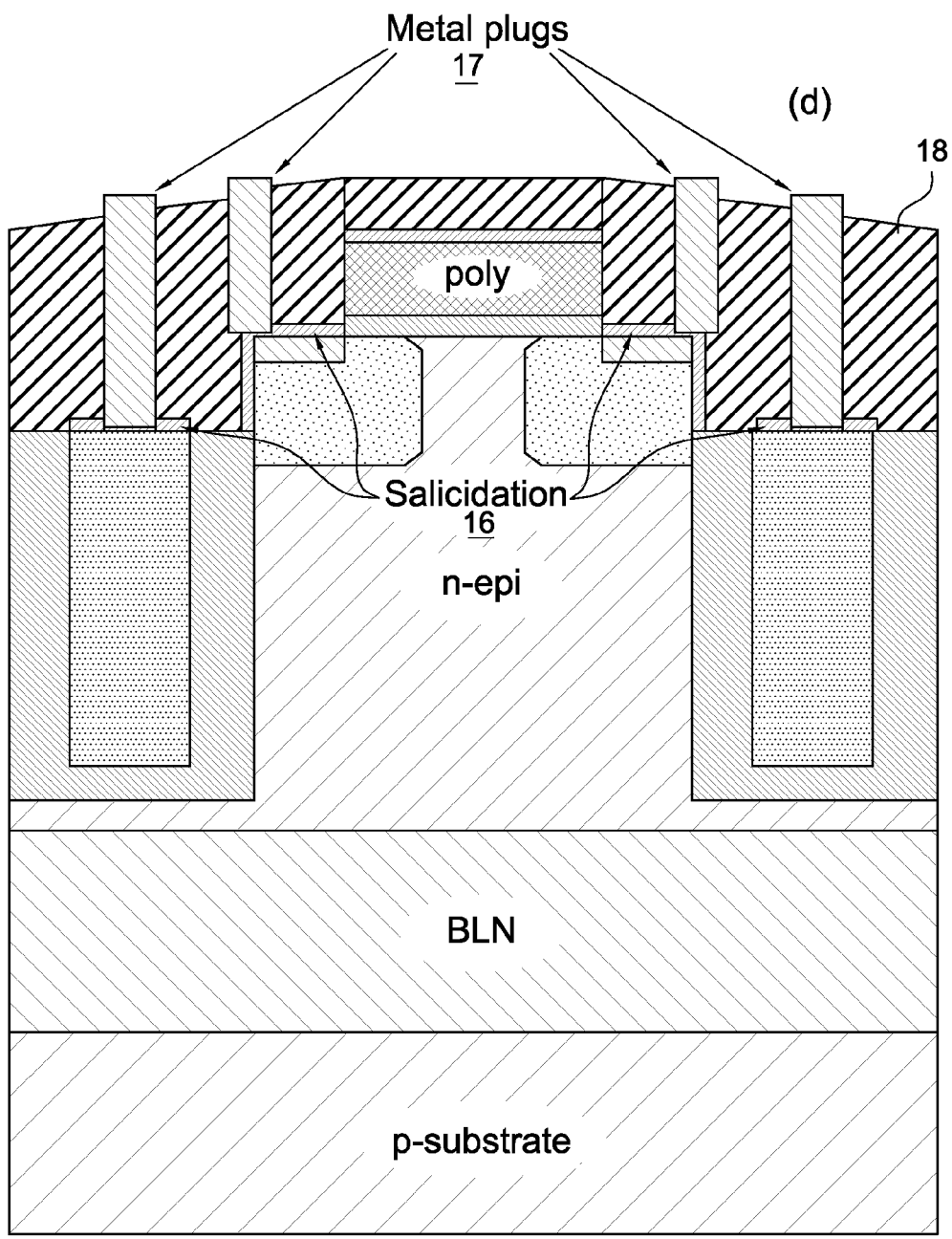

One example of a manufacturing process for a field effect power transistor of the first embodiment of the kind shown in FIGS. 2 and 5 is as follows.
 (i) On top of a lowly doped semiconductor substrate of a first conductivity type, e.g. a lowly doped p-substrate (1) and a buried layer of a second conductivity type, e.g. a buried layer n-implant (2), a moderately doped layer of the second conductivity type, e.g. a moderately doped n-epi (3) is grown. This is an example of the first layer. The concentration of the n-epi (3) is preferably tuned for optimal performance of the device, and is as such dependent on the targeted Vbd. It will be in the order of $10^{16}$ atoms/$cm^3$ for the voltage range of interest (50-200V).
 (ii) To form a control electrode structure such as a gate structure, first an insulating layer is grown, e.g. a gate oxide (4). A control electrode is then formed, e.g. a gate polysilicon layer (5) is deposited. On top, a hard mask is formed, e.g. a nitride hard mask (6) is deposited. A photo resist mask is used to etch the nitride and polysilicon layers. The p-body (7) is implanted self-aligned to the gate polysilicon. Then the n+ is implanted (8) with the same mask, making it also self-aligned to the polysilicon gate. Subsequently, the photoresist is removed. See FIG. 2 showing stage (a).

Figure 3:
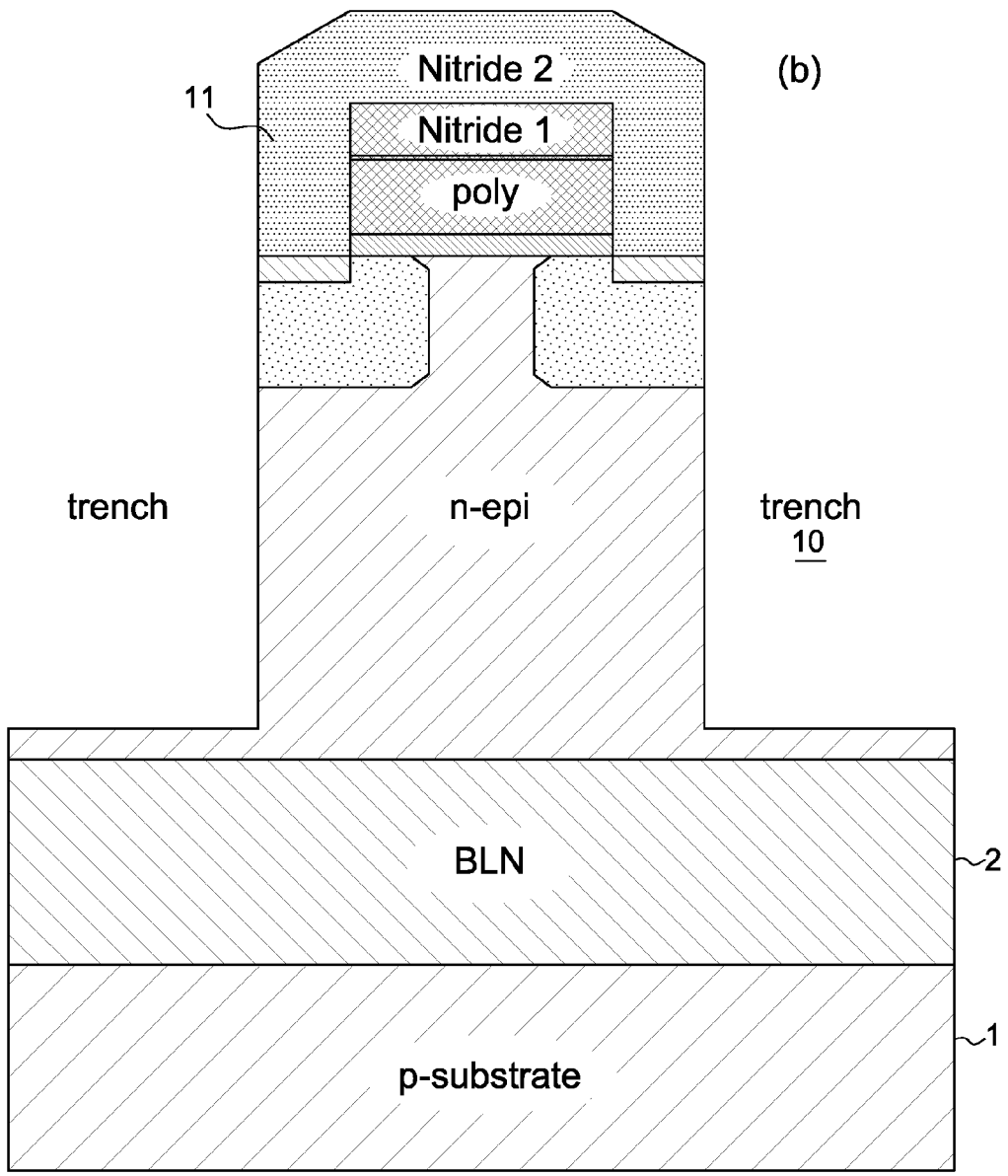

(iii) A spacer layer in the form of a second insulating layer such as a nitride layer (11) is deposited and etched. The thus formed insulating spacers, e.g. nitride spacers at the sides of the control electrode structure, e.g. gate structure are for example approximately 1 μm wide or less (the width of the spacer is mainly a function of the space required for the p-body 7 and the n+ implant 8). These spacers are used to etch the trench (10) self-aligned to the polysilicon layer. The trench depth is typically 5 μm for a 100V rated device. See FIG. 3 showing stage (b).

Figure 4:
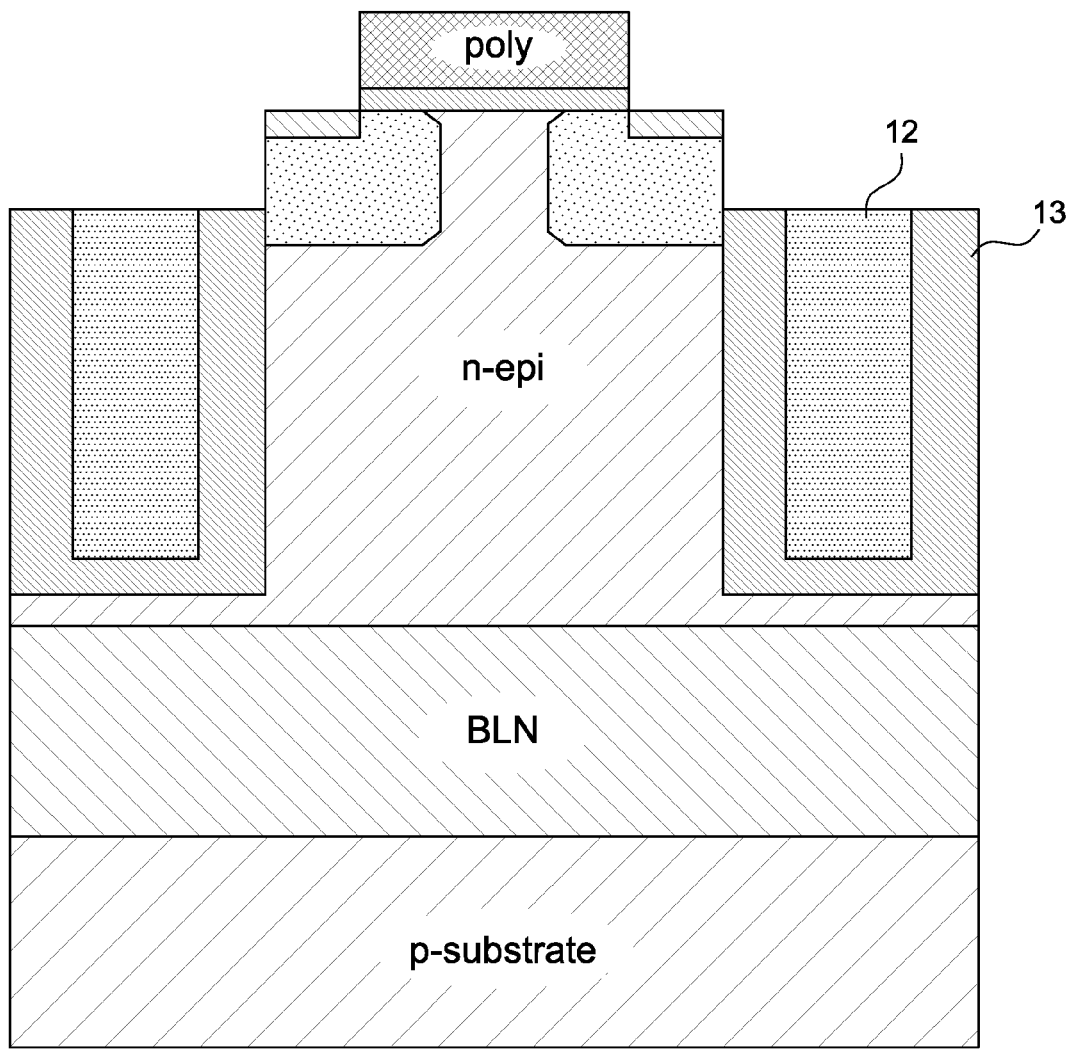

(iv) A further insulating layer is grown in the trench, e.g. an oxide layer (13) is grown in the trench. The thickness is typically 500 nm. Then the trench is filled with semiconductor material of any conductivity type such as e.g. a highly doped p+ polysilicon (12). This polysilicon is etched back to a level of approximately 0.5 μm deep in the silicon, as well as the oxide 13. This is to allow the p-body to be contacted at the sidewall. Subsequently both nitride layers are removed. See FIG. 4 showing stage (c).

(v) The n+ layer, pbody (sidewall), gate polysilicon and trench polysilicon are salicided (16). A passivating layer such as a BPSG oxide (18) is deposited. Contacts are etched and the n+/pbody and trench poly are contacted by conductive, e.g. metal plugs (17) separately. See FIG. 5 showing stage (d).

(vi) The buried layer of the second conductivity type BLN, e.g. of type n, i.e. the drain electrode of the power transistor, is contacted (not shown) with sinkers of the second conductivity type, e.g. n type sinkers.

The second embodiment described below elaborates on the fabrication of the trenches and how the filler material is contacted. The proposed method uses a lateral overgrowth of an epitaxial layer (see FIG. 8 in particular). It can further reduce the device area for the same $R_{ON}$.

(i) On top of the lowly doped substrate of the first conductivity type, e.g. the lowly doped p-substrate (1) and a buried layer of the second conductivity type, e.g. a buried layer n-implant (2), a first layer in the form of a moderately doped semiconductor layer of the second conductivity type is grown, e.g. a moderately doped n-epi (3). The concentration of the n-epi (3) is preferably tuned for optimal performance of the device, and is as such dependent on the targeted Vbd. It will be in the order of $10^{16}$ atoms/cm$^3$ for the voltage range of interest (50-200V)

(ii) A hard mask layer is deposited, e.g. comprising or consisting of a stack of oxide (20) and nitride (21).

Figure 6:
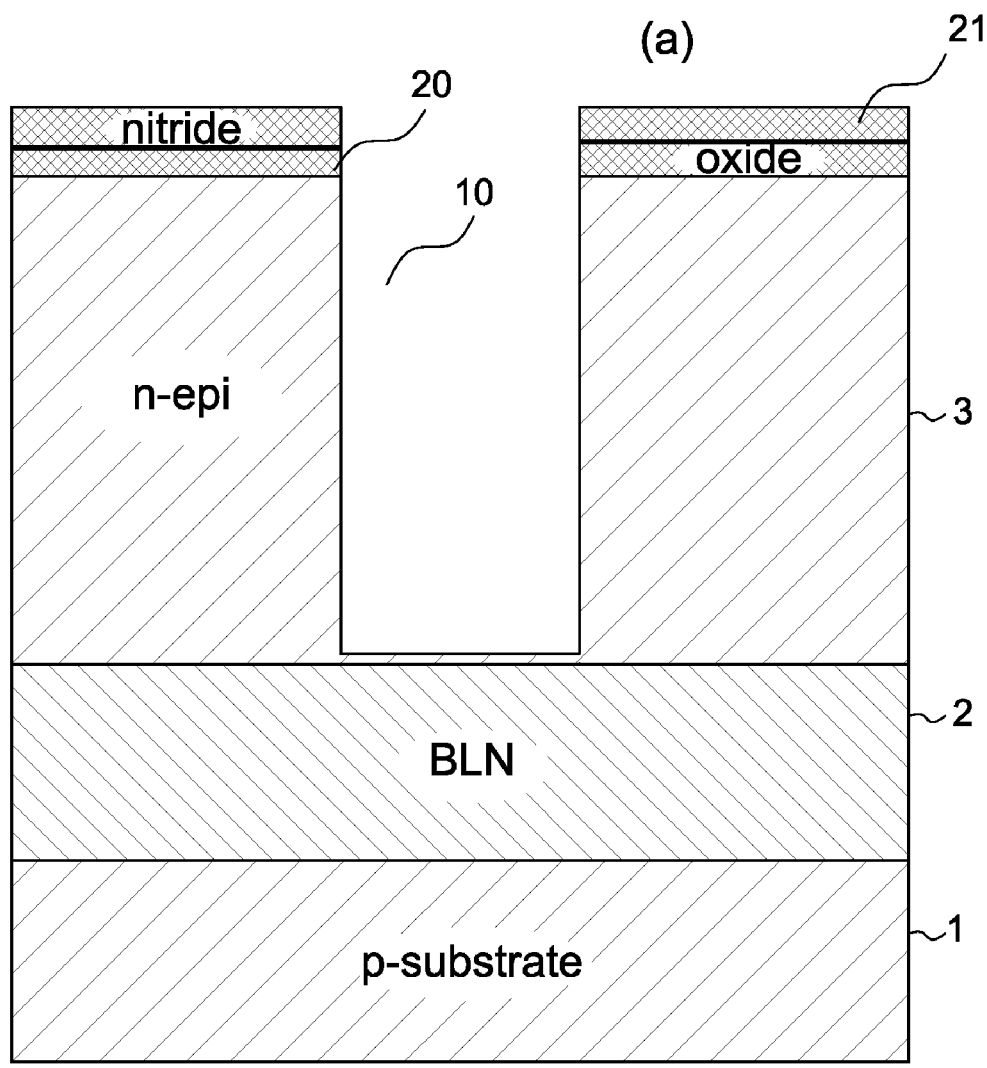
FIGS. 6 to 9 show manufacturing stages of a second embodiment.

(iii) The hard mask HM is etched in the regions where the trenches (10) have to be made, followed by a surface clean. A trench is etched into the silicon. The target depth is around 5 μm (for 100V) with a feature size of approximately 1 μm. The bottom profile is preferably well controlled. Sharp corners are preferably avoided. FIG. 6 shows the device after the trench is etched.

Figure 7:
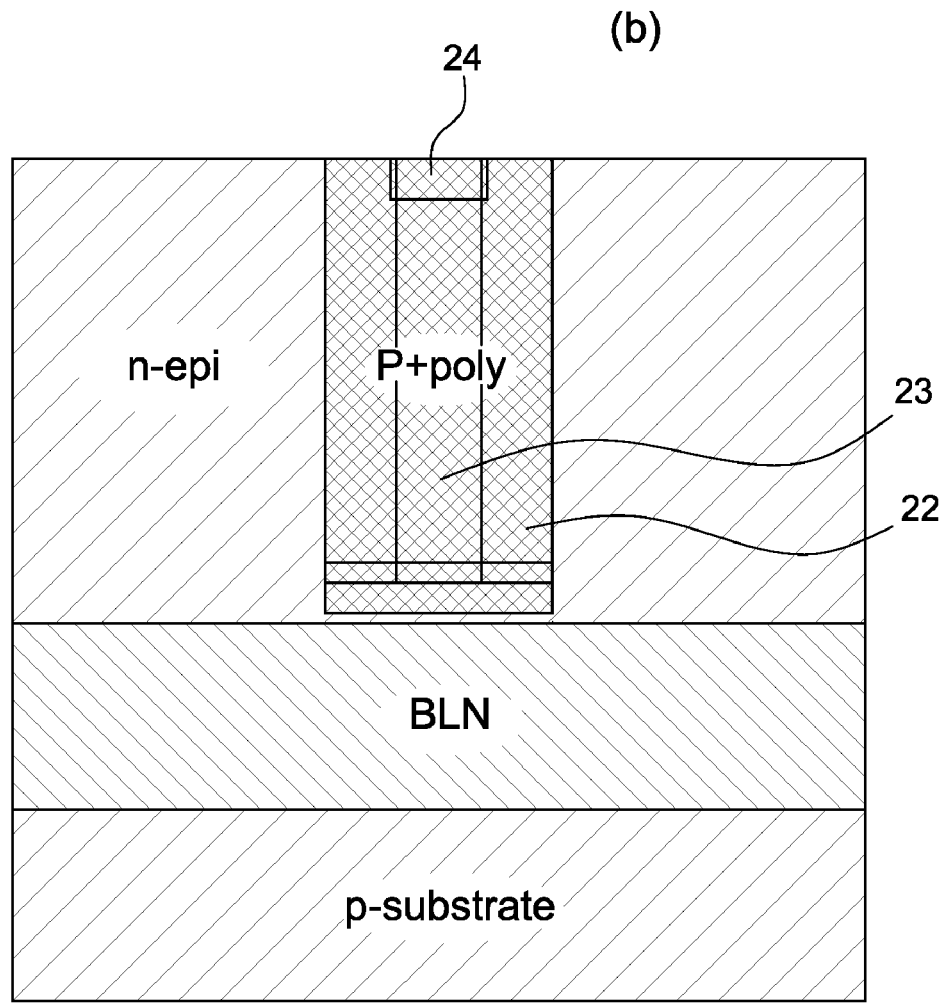

(iv) An insulating layer such as an oxide layer (22) is grown in the trenches. Target thickness is 500 nm. No oxide needs to be grown on top of the nitride. Afterwards, a highly doped semiconductor layer of any conductivity type, e.g. a highly doped p-type polysilicon layer (23) is deposited in the trench and the structure is planarized. An oxidation is performed. An oxide layer (24) will only grow on top of the highly doped p+ polysilicon, thus sealing the trench. Then the nitride and top oxide is etched. FIG. 7 shows the device after the sidewalls and bottom of the trench are covered with insulator. As shown, the trench is filled with a conducting material, and the top is covered with insulator.

Figure 8:
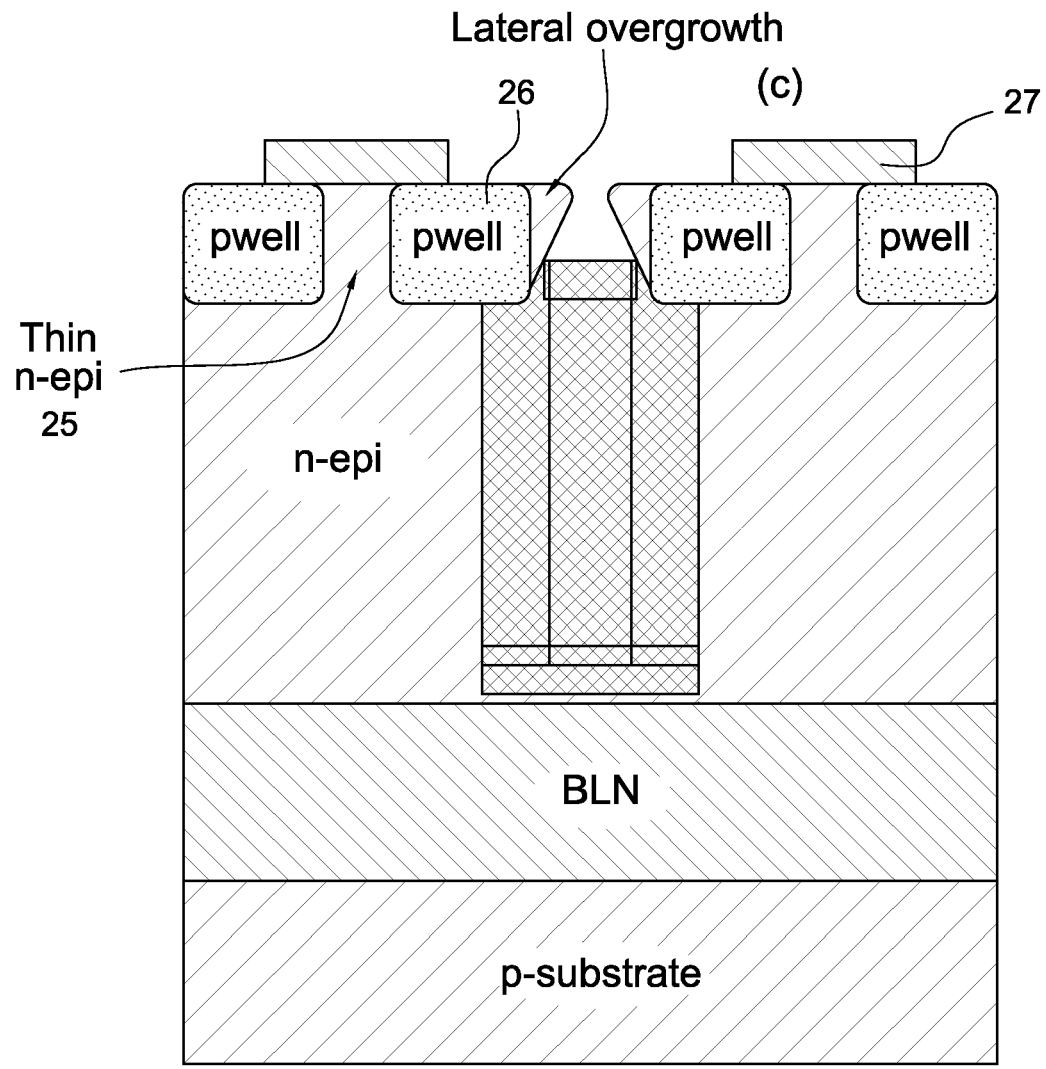

(v) A control electrode structure, e.g. a gate structure and one of the main electrode regions, e.g. a source region are then formed as follows. A second layer in the form of an epitaxial layer (25) with the same concentration as the n-epi (3) is grown. Thickness can be in the order of 1 μm. No epitaxial material will grow on the oxide, unless coming from the sidewall (lateral overgrowth). The epitaxial layer might be a little bit crumbled here, but this is not a disadvantage (see later). Then a well is implanted of the first conductivity type, e.g. a p-well (26) is implanted, and a conductive control electrode is formed, e.g. a polysilicon gate (27) is deposited. The p-well is implanted self-aligned to the gate mask. FIG. 8 shows the effect of the lateral overgrowth.

Figure 9:
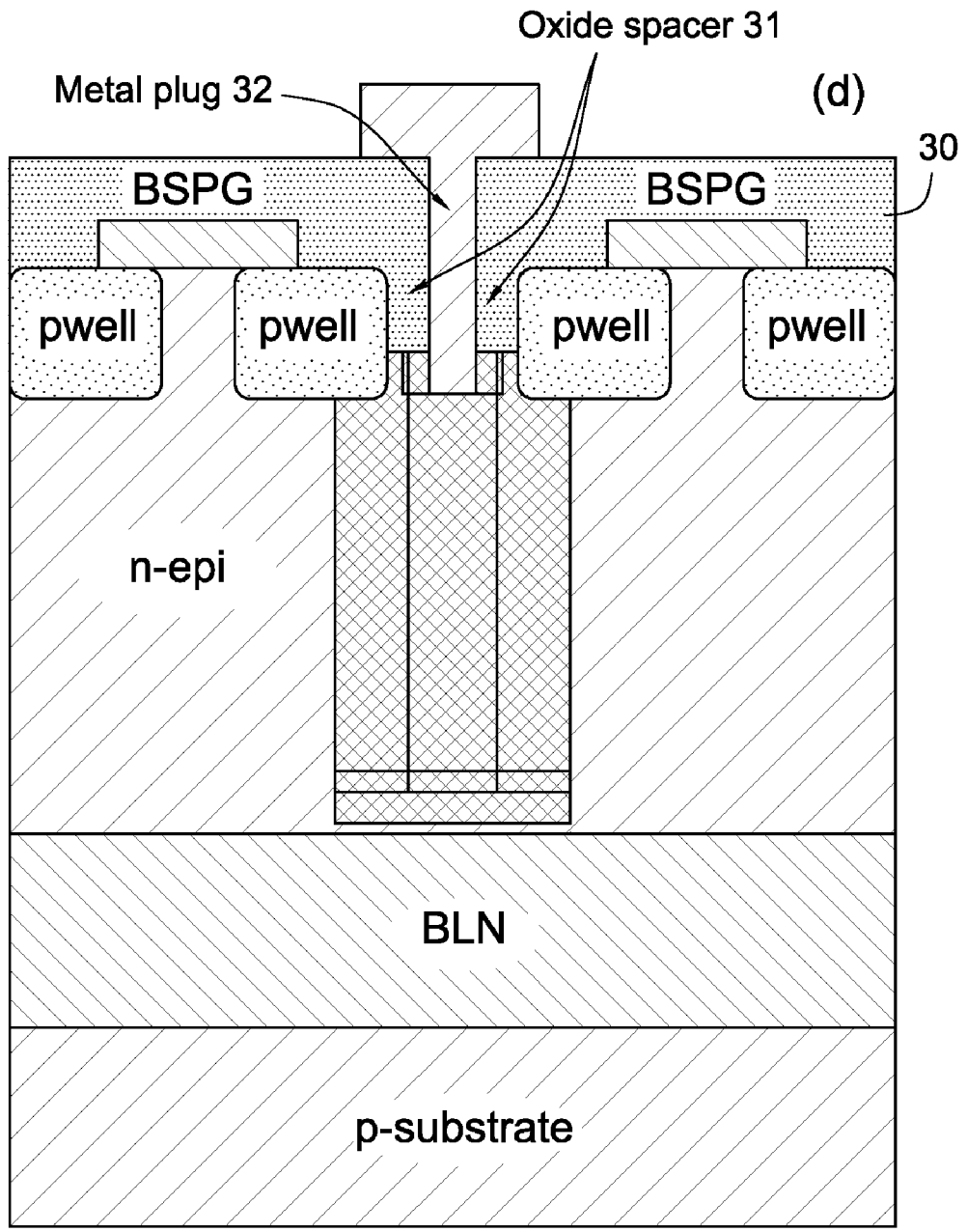

(vi) The lateral overgrowth is etched. A passivating layer such as a BPSG layer (30) is deposited. After etching, spacers (31) will be present. The oxide on top of the p+ polysilicon in the trench is removed. Subsequently, the trench polysilicon is contacted with a conductive material such as a metal (32). FIG. 9 shows the device after a metal plug is formed to contact the material inside the trench. The trench polysilicon only needs to be contacted at given intervals, this can be for example at the periphery of the device.

The final structure has the p-well isolated from the trench polysilicon by an oxide layer. As such, the trench polysilicon can be put at a different potential, improving the device performance. The trench is partially under the p-well, thus reducing the device area.

As discussed above, manufacturing a power transistor involves forming a control electrode structure such as a gate structure on a first layer, forming a trench in the first layer, self aligned with the gate structure, and forming part of the transistor in the trench. By forming a spacer next to the gate, the spacer and gate can be used as a mask when forming the trench, to allow space for a source region next to the gate. The self-aligning rather than forming the gate after the trench means the alignment is more accurate, allowing size reduction. Another aspect involves forming a trench in a first layer, filling the trench, forming a second layer on either side of the trench with lateral overgrowth over the trench, and forming a source region in the second layer to overlap the trench. This overlap can enable the chip area to be reduced.

Other variations can be envisaged within the scope of the claims.

The invention claimed is:

1. A transistor comprising a trench in a first layer, filled with a material, a second layer formed on either side of the trench with lateral overgrowth over the trench, and a main electrode region formed in the second layer so as to overlap the trench.

2. The transistor of claim 1, comprising a drift region in the first layer.

3. The transistor of claim 1, comprising a vertical MOS device having a buried drain or source below the first layer.

4. The transistor of claim 1, comprising a discrete component wherein a drain electrode is connected at the backside of the component.

5. The transistor of claim 1, comprising a power transistor having multiple cells, each cell having a trench.

* * * * *